(12) United States Patent
Ueda et al.

(10) Patent No.: US 12,060,641 B2
(45) Date of Patent: Aug. 13, 2024

(54) FILM FORMING METHOD AND FILM FORMING APPARATUS

(71) Applicant: Tokyo Electron Limited, Tokyo (JP)

(72) Inventors: Hirokazu Ueda, Osaka (JP); Hideki Yuasa, Yamanashi (JP); Yutaka Fujino, Yamanashi (JP); Yoshiyuki Kondo, Yamanashi (JP); Hiroyuki Ikuta, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 395 days.

(21) Appl. No.: 17/577,656

(22) Filed: Jan. 18, 2022

(65) Prior Publication Data
US 2022/0235462 A1    Jul. 28, 2022

(30) Foreign Application Priority Data

Jan. 25, 2021  (JP) .................. 2021-009876

(51) Int. Cl.
*C23C 16/455*  (2006.01)
*C23C 16/34*   (2006.01)
(Continued)

(52) U.S. Cl.
CPC ...... *C23C 16/45536* (2013.01); *C23C 16/345* (2013.01); *C23C 16/36* (2013.01);
(Continued)

(58) Field of Classification Search
CPC . C23C 16/45536; C23C 16/345; C23C 16/36; C23C 16/511; C23C 16/045; C23C 16/45523; C23C 16/303; C23C 16/52; H01J 37/32192; H01J 37/32449; H01J 37/32311; H01J 2237/332; H01L 21/02274; H01L 21/02167; H01L 21/0217; H01L 21/02211; H01L 21/0228; H01L 21/02304

See application file for complete search history.

(56) References Cited

U.S. PATENT DOCUMENTS

| 9,530,674 B2 * | 12/2016 | Yieh ................. H01J 37/32009 |
| 2012/0064713 A1 * | 3/2012 | Russell ............. H01L 21/76831 |
| | | 257/E21.258 |
| 2020/0111660 A1 | 4/2020 | Park et al. |

FOREIGN PATENT DOCUMENTS

| JP | 2017-120884 A | 7/2017 |
| JP | 2019-134062 A | 8/2019 |

* cited by examiner

*Primary Examiner* — Dale E Page
*Assistant Examiner* — Quovaunda Jefferson
(74) *Attorney, Agent, or Firm* — Nath, Goldberg & Meyer; Jerald L. Meyer; Tanya E. Harkins (57) ABSTRACT

A film forming method includes: placing a substrate on which a pattern, which includes a plurality of convex and concave portions, is formed on a stage disposed inside a chamber; and selectively forming a silicon-containing film on the plurality of convex portions of the pattern by applying a bias power to the stage and introducing microwaves into the chamber while supplying a processing gas containing a silicon-containing gas and a nitrogen-containing gas into the chamber to generate plasma, wherein the selectively forming the silicon-containing film includes a first film formation of forming a silicon-containing film around upper sides of the plurality of convex portions and a second film formation of forming a silicon-containing film on upper portions of the plurality of convex portions.

20 Claims, 5 Drawing Sheets

(51) Int. Cl.
    *C23C 16/36*         (2006.01)
    *C23C 16/511*      (2006.01)
    *H01J 37/32*       (2006.01)
    *H01L 21/02*       (2006.01)

(52) U.S. Cl.
    CPC ...... *C23C 16/511* (2013.01); *H01J 37/32192* (2013.01); *H01J 37/32449* (2013.01); *H01L 21/02274* (2013.01); *H01J 2237/332* (2013.01); *H01L 21/02167* (2013.01); *H01L 21/0217* (2013.01)

FILM FORMING METHOD AND FILM FORMING APPARATUS

CROSS-REFERENCE TO RELATED APPLICATION

This application is based upon and claims the benefit of priority from Japanese Patent Application No. 2021-009876, filed on Jan. 25, 2021, the entire contents of which are incorporated herein by reference.

TECHNICAL FIELD

The present disclosure relates to a film formation method and a film formation apparatus.

BACKGROUND

Patent Document 1 discloses, as a method of manufacturing a semiconductor device, a technique of forming an adsorption control layer that covers the upper portion of a 3D structure formed on a substrate and forming a material layer on the adsorption control layer and on a lower portion of the 3D structure that is not covered with the adsorption control layer.

PRIOR ART DOCUMENT

[Patent Document]
Patent Document 1: U.S. Patent Application Publication No. 2020/0111660

SUMMARY

According to an embodiment of the present disclosure, there is provided a film forming method includes: placing a substrate on which a pattern, which includes a plurality of convex and concave portions, is formed on a stage disposed inside a chamber; and selectively forming a silicon-containing film on the plurality of convex portions of the pattern by applying a bias power to the stage and introducing microwaves into the chamber while supplying a processing gas containing a silicon-containing gas and a nitrogen-containing gas into the chamber to generate plasma, wherein the selectively forming the silicon-containing film includes a first film formation of forming a silicon-containing film around upper sides of the plurality of convex portions and a second film formation of forming a silicon-containing film on upper portions of the plurality of convex portions.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a film forming method and a film forming apparatus disclosed herein will be described in detail with reference to the drawings. The film forming method and the film forming apparatus are not limited by the embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In recent years, with the miniaturization of semiconductor devices, the aspect ratios of patterns formed on substrates such as semiconductor wafers has tended to increase. For example, in the manufacture of 3D NANDs, since the opening widths of trenches and vias formed on substrates are narrowed, high aspect ratio structuring is progressing. When a barrier layer or a liner layer is conformally formed in such a trench or via, atomic layer deposition (ALD) is generally used. However, even if ALD film formation, which is excellent in step coverage, is used when trying to conformally form a barrier layer or a liner layer in a trench or via with a high aspect ratio structure, throughput (productivity) becomes a very significant problem because the adsorption and purge time of a raw material gas, which is longer than that of a normal ALD film forming sequence, is required. In a normal ALD film forming sequence, a film thickness is thick at the top of a trench or via and thin at the bottom, causing overhang and poor step coverage, which is problematic.

Therefore, as in Patent Document 1, it is conceivable to form an adsorption control layer on the upper portion of a pattern through plasma enhanced chemical vapor deposition (PECVD) and then form a material layer such as a barrier layer or a liner layer through ALD.

However, in the PECVD, the shape (profile) of a film cannot be controlled to a shape in which a film having good uniformity is obtained in a concave portion through film formation by the ALD. Therefore, there is a need of a technique for controlling the shape of a silicon-containing film to be formed into a shape in which a film having good uniformity is obtained in a concave portion through film formation by ALD.

EMBODIMENTS

[Configuration of Apparatus]

Figure 1:
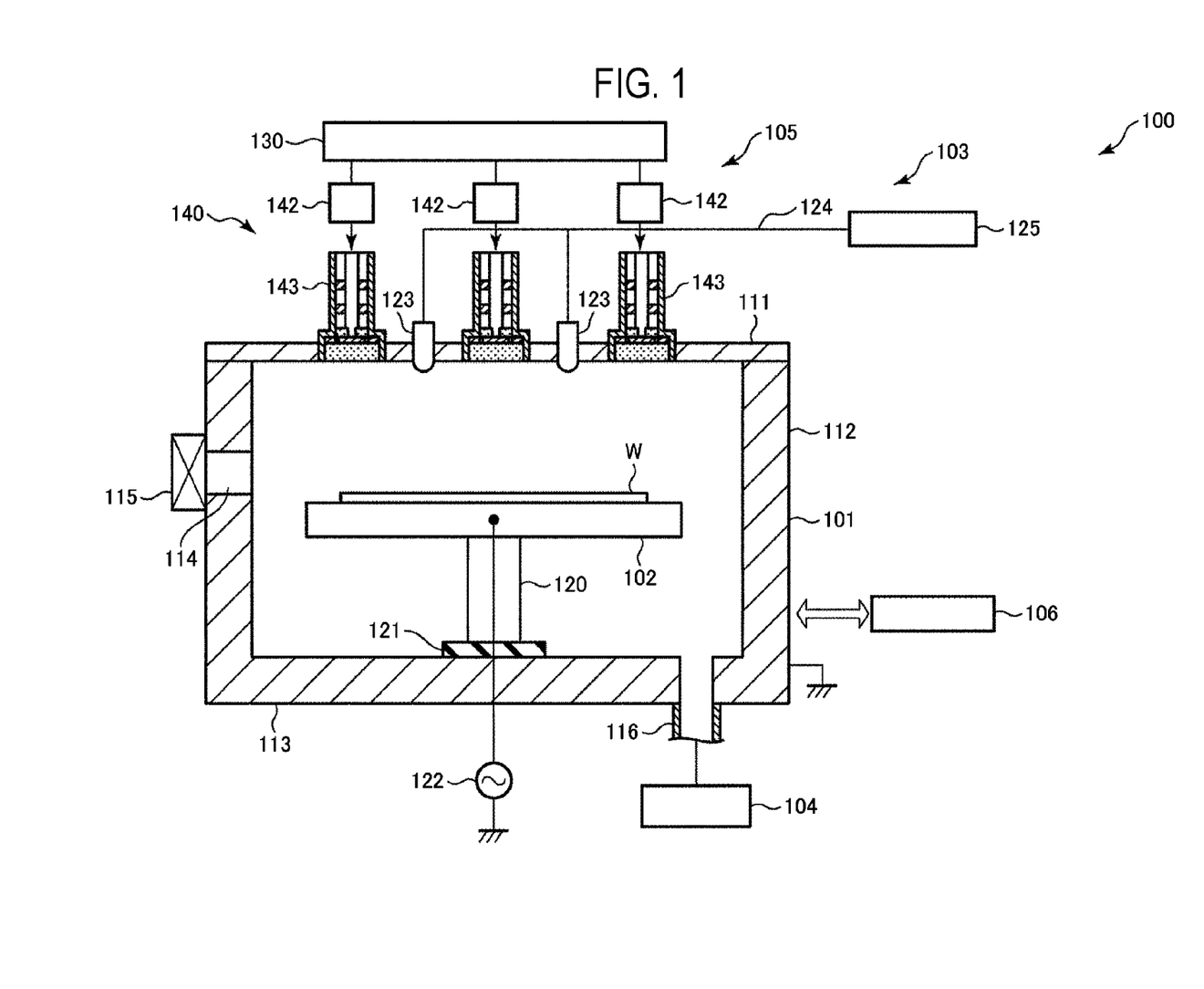
FIG. 1 is a cross-sectional view schematically illustrating an example of a plasma processing apparatus according to an embodiment.

An example of a plasma processing apparatus for executing a film forming method of the present disclosure will be described. FIG. 1 is a cross-sectional view schematically illustrating an example of a plasma processing apparatus 100 according to an embodiment.

The plasma processing apparatus 100 includes a chamber 101, a stage 102, a gas supply mechanism 103, an exhaust mechanism 104, a microwave plasma source 105, and a controller 106.

The chamber 101 is made of a metal material, for example, aluminum having an anodized surface, and has a substantially cylindrical shape. The chamber 101 has a plate-shaped ceiling wall 111, a bottom wall 113, and a side wall 112 connecting the ceiling wall 111 and the bottom wall 113 to one another. The inner wall of the chamber 101 may be coated with yttria ($Y_2O_3$) or the like. The stage 102 is disposed inside the chamber 101. The chamber 101 accommodates a substrate W such as a semiconductor wafer.

The ceiling wall 111 includes a plurality of openings into which a microwave radiation mechanism 143 and the gas introduction nozzle 123 (which will be described later) of the microwave plasma source 105 are fitted. The side wall 112 includes a carry-in/out port 114 for performing carry-in/out of the substrate W to/from a transfer chamber (not illustrated) adjacent to the chamber 101. The carry-in/out port 114 is opened and closed by a gate valve 115. An exhaust pipe 116 is connected to the bottom wall 113.

The stage 102 is formed in a disk shape, and is made of a metal material, for example, aluminum having an anodized surface, or a ceramic material, for example, aluminum nitride (AlN). The substrate W is placed on the top surface of the stage 102. The stage 102 is supported by a support member 120, which is a metal cylinder extending upward from the center of the bottom of the chamber 101 via an insulating member 121. An electrostatic chuck (not illustrated) that attracts and holds the substrate W by electrostatic force may be provided on the top surface of the stage 102.

Inside the stage 102, lifting pins (not illustrated) for raising and lowering the substrate W are provided to be capable of protruding and retracting with respect to the top surface of the stage 102. In addition, a temperature control mechanism (not shown) including a temperature control medium flow path or a heater through which the temperature control medium flows, or both the temperature control medium flow path and the heater are provided inside the stage 102 so that the temperature of the substrate W on the stage 102 can be controlled to a predetermined temperature.

From the viewpoint of performing a good plasma process, the stage 102 is provided at a position at which a distance from the bottom surface of the ceiling wall 111, which is the microwave radiation surface of the microwave radiation mechanism 143, to the substrate W may be in the range of 40 to 200 mm. The microwave transmission frequency of the microwave radiation mechanism 143 is in the range of 300 MHz to 30 GHz, and the input power may be 500 W or more in order to maintain plasma stably.

A high-frequency power supply 122 for ion attraction is electrically connected to the stage 102. When the stage 102 is made of ceramic, an electrode is provided in the stage 102, and the high-frequency power supply 122 is electrically connected to the electrode. The high-frequency power supply 122 applies high-frequency (RF) power as the bias power to the stage 102. The frequency of the high-frequency power applied by the high-frequency power supply 122 may be in the range of 300 KHz to 3 MHz.

The gas supply mechanism 103 supplies various processing gases for forming a film into the chamber 101. The gas supply mechanism 103 includes a plurality of gas introduction nozzles 123, a gas supply pipe 124, and a gas supplier 125. The gas introduction nozzles 123 are fitted into openings formed in the ceiling wall 111 of the chamber 101. The gas supplier 125 is connected to each gas introduction nozzle 123 via the gas supply pipe 124. The gas supplier 125 supplies various processing gases. For example, the gas supplier 125 includes sources of various processing gases including a silicon-containing gas and a nitrogen-containing gas, and supplies various processing gases including the silicon-containing gas and the nitrogen-containing gas. The gas supplier 125 may further include a noble gas source and a carbon-containing gas source, and may further supply a noble gas and a carbon-containing gas as the processing gases. In addition, the gas supplier 125 is provided with an opening/closing valve for performing supply and cutoff of a processing gas and a flow rate adjuster for adjusting the flow rate of the processing gas.

An exhaust pipe 116 is connected to the bottom wall 113 of the chamber 101. The exhaust mechanism 104 is connected to the exhaust pipe 116. The exhaust mechanism 104 includes a vacuum pump and a pressure control valve, and exhausts the interior of the chamber 101 through the exhaust pipe 116 by a vacuum pump. An internal pressure of the chamber 101 is controlled by the pressure control valve based on a value of a pressure gauge.

The microwave plasma source 105 is provided above the chamber 101. The microwave plasma source 105 introduces electromagnetic waves (microwaves) into the chamber 101 to generate plasma.

The microwave plasma source 105 includes a microwave output part 130 and an antenna unit 140. The antenna unit 140 includes a plurality of antenna modules. In FIG. 1, the antenna unit 140 includes three antenna modules. Each antenna module includes an amplifier 142 and a microwave radiation mechanism 143. The microwave output part 130 generates microwaves, distributes microwaves, and outputs the microwaves to each antenna module. The amplifier 142 of the antenna module mainly amplifies the distributed microwaves and outputs the amplified microwaves to the microwave radiation mechanism 143. The microwave radiation mechanism 143 is provided on the ceiling wall 111. The microwave radiation mechanism 143 radiates the microwaves output from the amplifier 142 into the chamber 101.

In FIG. 1, the case in which three antenna modules are provided in the antenna unit 140 has been described as an example, but the number of antenna modules is not limited. For example, six antenna modules may be provided such that the vertices of a regular hexagon are arranged in the region of the ceiling wall 111 above the stage 102. By arranging an antenna module at the center position of the hexagon as well, seven antenna modules may be provided.

As long as a microwave power density can be appropriately controlled, a microwave plasma source having a single microwave introduction part having a size corresponding to a substrate W may be used.

The controller 106 is, for example, a computer including a processor, a storage part, an input device, a display device, and the like. The controller 106 controls each part of the plasma processing apparatus 100. In the controller 106, an operator may perform, for example, a command input operation in order to manage the plasma processing apparatus 100 using the input device. In addition, in the controller 106, the operation situation of the plasma processing apparatus 100 may be visualized and displayed by the display device. Furthermore, the storage part of the controller 106 stores a control program and recipe data for controlling various processes, which are executed in the plasma processing apparatus 100, by the processor. The processor of the controller 106 executes the control program and controls each part of the plasma processing apparatus 100 according to the recipe data, whereby desired processing is executed in the plasma processing apparatus 100. For example, the controller 106 controls each part of the plasma processing apparatus 100 to execute the processes of the film forming method according to the embodiment.

As described above, the aspect ratios of patterns formed on substrates W tend to increase as semiconductor devices become finer. For example, in the manufacture of 3D NANDs, the opening widths of trenches and vias formed on substrates W are narrowed, so that high aspect ratio structuring is progressing. When a barrier layer or a liner layer is conformally formed in such a trench or via, it is common to use ALD. However, when trying to form a barrier layer or a liner layer through ALD in a trench or via with a high aspect ratio structure, the film thickness is thick at the top of the trench or via and thinner at the bottom, thereby causing overhang or poor step coverage, which is problematic.

Figure 2:
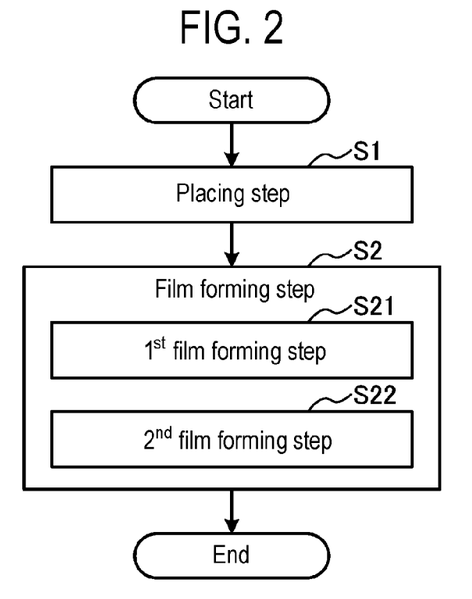
FIG. 2 is a flowchart illustrating an example of a flow of a film forming method according to an embodiment.

Therefore, prior to the step of forming a barrier layer or a liner layer in a trench or a via through ALD, an insulating film, such as a silicon-containing film or a carbon-containing film, as an adsorption control layer is formed as a structure using the plasma processing apparatus 100 by the film forming method according to the present disclosure. FIG. 2 is a flowchart illustrating an example of a flow of a film forming method according to an embodiment.

Next, a processing operation when the film forming process of the film forming method according to the embodiment is performed by the plasma processing apparatus 100 configured as described above will be described. FIG. 2 is a flowchart illustrating an example of the flow of a film forming method according to an embodiment.

Figure 3:
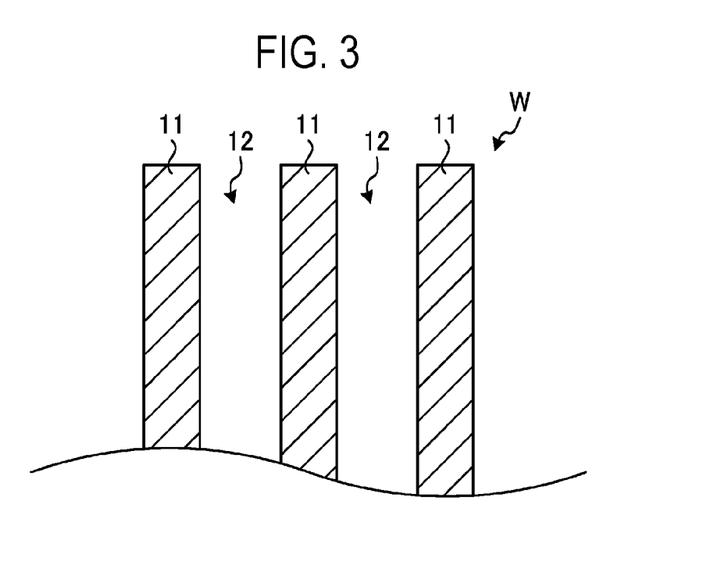
FIG. 3 is a view illustrating an example of a substrate according to an embodiment.

In the film forming method according to the embodiment, a placing step S1 is executed. In the placing step S1, the substrate W is placed on the stage 102 disposed in the chamber 101. On the substrate W, a pattern including a plurality of convex and concave portions are formed. FIG. 3 is a view illustrating an example of the substrate W according to the embodiment. FIG. 3 illustrates the substrate W on which a pattern including convex and concave portions are formed. Concave portions 12 between convex portions 11 of the substrate W are, for example, trenches or vias.

In the film forming method according to the embodiment, a film forming step S2 is subsequently executed. In the film forming step S2, a bias power is applied to the stage 102, and microwaves are introduced into the chamber 101 while supplying a processing gas containing a silicon-containing gas and a nitrogen-containing gas into the chamber 101 to generate plasma, so that a silicon-containing film is selectively formed on the plurality of convex portions 11 of the pattern.

The silicon-containing gas may be, for example, silane-based hydrogen gas or silane-based halogen gas, and may be any one of $SiH_4$, $Si_2H_6$, and $SiH_2Cl_4$. The nitrogen-containing gas may be, for example, a hydrogen nitride-based gas of $NH_3$, $N_2H_2$, $N_3H_5$ or the like, such as ammonia, hydrazine, or triazane, and nitrogen gas $N_2$ alone. In the film forming step S2, another gas such as a noble gas or a carbon-containing gas may be further supplied as a processing gas. For example, by adding a small amount of a carbon-containing gas (e.g., about 0.1 to 5 [sccm] of $C_2H_6$ gas), it is possible to form a SiCN film more excellent in chemical resistance (wet etching resistance) without changing a SiN shape characteristic of the film forming step S2. The noble gas may be a monatomic element that may be represented in Group 18 of the periodic table, and may be, for example, Ar (argon) gas or He (helium). The carbon-containing gas may be a gas of any of hydrocarbons such as $C_2H_6$, $CH_4$, and $C_3H_8$. Here, an organic silane material such as trimethylsilane (TMS) $(CH_3)_3SiH$ may be used as the carbon-containing gas.

The internal pressure of the chamber 101 in the film forming step S2 may be 1.5 Torr or less, specifically 50 to 100 m Torr. Flow rates of the various processing gases are those obtained in advance so that the film quality of a silicon-containing film to be formed is optimized.

The film forming step S2 includes a first film forming step S21 and a second film forming step S22. In the first film forming step S21, a silicon-containing film is formed around the upper sides of the plurality of convex portions 11 of the pattern. In the second film forming step S22, a silicon-containing film is formed on the upper portions of the plurality of convex portions 11 of the pattern.

In the film forming step S2, the second film forming step S22 may be executed after the first film forming step S21, or the first film forming step S21 may be executed after the second film forming step S22. In the film forming step S2, the first film forming step S21 and the second film forming step S22 may be alternately executed multiple times.

In the film forming step S2, $\frac{5}{6}$ to $\frac{1}{2}$ of the total film thickness of the silicon-containing film to be formed is formed through the first film forming step S21, and the rest of the total film thickness is formed through the second film forming step 22. Here, the basis for setting the film thickness in the first film forming step S21 to $\frac{5}{6}$ to $\frac{1}{2}$ of the total film thickness and for forming the film of the rest thickness in the second film forming step S22 is that the optimum distribution was derived from an experiment based on optimum three-dimensional formation as the "adsorption control layer" in the film forming step S2. The most preferable distribution is close to $\frac{1}{2}$, which is the same for both the first film forming step S21 and the second film forming step S22, but even if the thickness of the film formed through the first film forming step S21 occupies $\frac{5}{6}$ of the total film thickness, it is possible to form a three-dimensional object as the desired "adsorption control layer".

Hereinafter, the first film forming step S21 and the second film forming step S22 will be described in more detail.

In the first film forming step S21, a silicon-containing film is formed under at least one condition selected from the group consisting of a higher bias power than that in the second film forming step S22 is applied to the stage 102 and the refractive index (RI) is higher than that in the second film forming step S22.

First, the case of changing the bias power will be described. In the first film forming step S21, a silicon-containing film is formed by applying a higher bias power than that in the second film forming step S22 to the stage 102. For example, in the first film forming step S21, a bias power of 200 W to 1,000 W is applied to the stage 102. In the second film forming step S22, a bias power of 0 to 200 W is applied to the stage 102.

Figure 4:
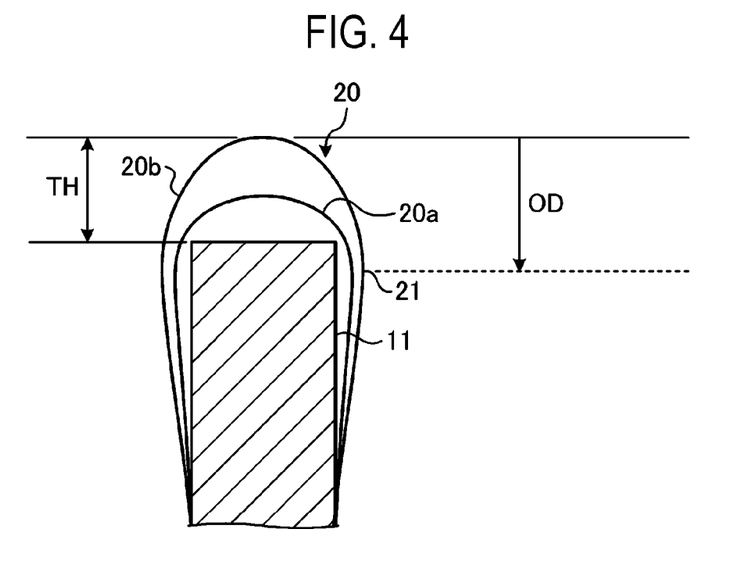
FIG. 4 is a view illustrating film formation results of a first film forming step and a second film forming step according to an embodiment.

FIG. 4 is a view illustrating film formation results of the first film forming step S21 and the second film forming step S22 according to the embodiment. FIG. 4 illustrates an enlarged view of a portion around the upper periphery of a convex portion 11 formed on the substrate W. FIG. 4 illustrates a case in which a SiN film 20 as the silicon-containing film is formed when the silicon-containing gas is $SiH_4$ gas, the nitrogen-containing gas is $NH_3$ gas, and the second film forming step S22 is performed after the first film forming step S21. In the first film forming step S21 and the second film forming step S22, as the processing conditions, only the bias power applied to the stage 102 is changed, and the other condition is the same. In the first film forming step S21, the bias power is set to 300 to 600 W. In the second film forming step S22, the bias power is set to 0 to 100 W. FIG. 4 illustrates the region of a SiN film 20a formed through the first film forming step S21 and the region of a SiN film 20b formed through the second film forming step S22 separately. In the first film forming step S21, the SiN film 20a is selectively formed around the upper side of the convex portion 11. In the second film forming step S22, the SiN film 20b is selectively formed on the upper portion of the convex portion 11 on which the SiN film 20a is formed.

In the second film forming step S2, the shape of the SiN film 20 formed by the SiN film 20a and the SiN film 20b can be controlled by forming the SiN film 20a and the SiN film 20b in the first film forming step S21 and the second film forming step S22. The SiN film 20 protrudes laterally (toward the adjacent concave portions 12) around the upper portion of the convex portion 11 and has an overhanging shape. In FIG. 4, the thickness of the SiN film 20 formed on the top surface of the convex portion 11 (top thickness) is indicated as a thickness TH. In addition, the most laterally protruding portion of the SiN film 20 is indicated as an overhang point 21. Further, the depth from the upper surface of the SiN film 20 to the position of the overhang point 21 (overhang depth) is indicated as OD. For example, by forming the SiN film 20 in the first film forming step S21 and the second film forming step S22, the depth OD of the overhang point 21 can be increased, and the position of the overhang point 21 of the SiN film 20 can be lowered. As a result, for example, the position of the overhang point 21 of the SiN film 20 can be made lower than the position of the top surface of the convex portion 11. Here, the significance (advantage) of deepening the OD will be explained. Generally, in PECVD performed without the two-step film formation step according to the present proposal, the OD cannot be formed deeply unless a strong RF bias is applied by a high-frequency power source connected to the stage 102. However, when an RF bias is strongly applied, even if the OD can be formed deeply, erosion (damage) may occur in the SiN film 20 due to a sputtering effect as a side effect, or the SiN film 20 may be formed to a depth of a concave portion of a base pattern. Thus, an optimum shape as a desired "adsorption control layer" cannot be obtained. Therefore, the ability to form the OD deeply is one of the indicators of the required performance of the "adsorption control layer".

Figure 5:
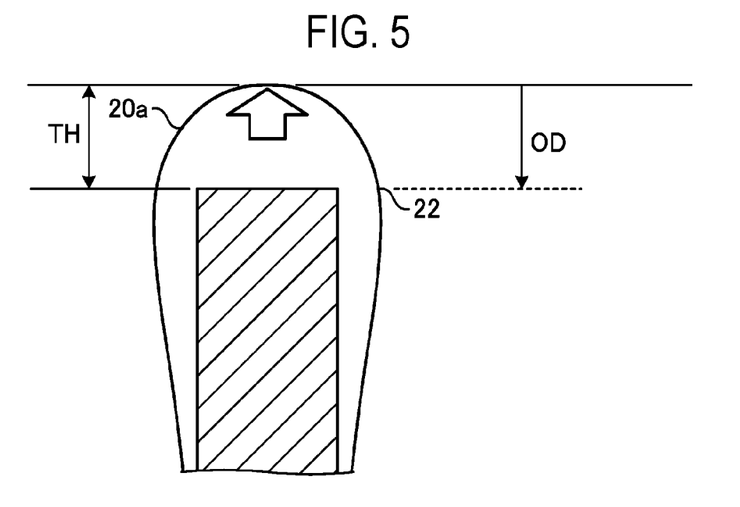
FIG. 5 is a view illustrating a film formation result of a comparative example.

Here, as a comparative example, the film forming step S2 will be described with reference to a case in which a film is formed only using the first film forming step S21. FIG. 5 is a diagram illustrating a film formation result of a comparative example. FIG. 5 illustrates the result of forming the SiN film 20a through the first film forming step S21 until the thickness TH is equivalent to that of the SiN film 20 of FIG. 4. The most laterally protruding portion of the SiN film 20a is indicated as an overhang point 22. In the first film forming step S21, since the SiN film 20a is formed around the upper side of the convex portion 11, the depth OD of the overhang point 22 from the top surface of the SiN film 20a becomes shallower. As a result, the position of the overhang point 22 of the SiN film 20a is higher than that of the overhang point 21 of the SiN film 20 of FIG. 4. Here, since the depth OD affects the margin (dimensional margin) of the processed shape after the execution of CMP or the like in the subsequent process, it is ideally desirable to deepen the depth OD to the same position as the TH.

The processing conditions such as the types and flow rates of processing gases, and the bias powers in the first film forming step S21 and the second film forming step S22 are as follows.

<First Film Forming Step S21>
Processing gas
$SiH_4$ gas: 3 to 60 sccm (specifically, 7 to 20 sccm)
$NH_3$ gas: 4 to 100 sccm (specifically, 9 to 40 sccm)
Inert gas for dilution: Ar gas: 50 to 1,000 sccm (specifically, 50 to 300 sccm)
Microwave power (860 MHz): 1,500 to 10,000 W (specifically, 2,500 to 5,000 W)
Bias power (400 KHz): 200 to 1,000 W (specifically, 300 to 600 W)

<Second Film Forming Step S22>
Processing gas
$SiH_4$ gas: 3 to 60 sccm (specifically, 7 to 20 sccm)
$NH_3$ gas: 4 to 100 sccm (specifically, 9 to 40 sccm)
Inert gas for dilution: Ar gas: 50 to 1,000 sccm (specifically, 50 to 300 sccm)
Microwave power (860 MHz): 1,500 to 10,000 W (specifically, 2,500 to 5,000 W)
Bias power (400 KHz): 0 to 200 W (specifically, 0 to 100 W)

Figure 6:
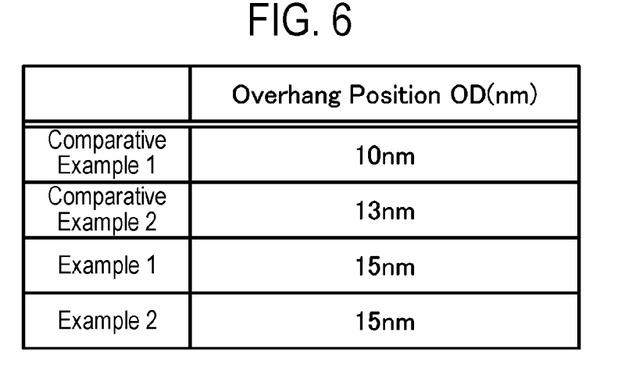
FIG. 6 is a view illustrating an example of film formation results.

FIG. 6 is a view illustrating an example of film formation results. Comparative Example 1 illustrates a case in which a SiN film was formed to have a thickness of 150 Å only through the second film forming step S22. Comparative Example 2 illustrates a case in which a SiN film was formed to have a thickness of 150 Å only through the first film forming step S21. Example 1 illustrates a case in which a SiN film was formed to have a thickness of 125 Å through the first film forming step S21, and then a SiN film was formed to have a thickness of 25 Å through the second film forming step S22, thereby forming a SiN film having a total thickness of 150 Å. Example 2 illustrates a case in which a SiN film was formed to have a thickness of 75 Å through the first film forming step S21, and then a SiN film was formed to have a thickness of 75 Å through the second film forming step S22, thereby forming a SiN film having a total thickness of 150 Å. "Overhang position OD (nm)" indicates the depth from the top surface of each SiN film to the position of the overhang point. As illustrated in FIG. 6, the "overhang position OD (nm)" is 10 nm in Comparative Example 1, 13 nm in Comparative Example 2, and 15 nm in Examples 1 and 2. As described above, in Examples 1 and 2, the depth to the overhang point is increased compared with Comparative Examples 1 and 2.

In FIG. 6, the SiN film was formed by performing the second film forming step S22 after the first film forming step S21. However, even when the first film forming step S21 is executed after the second film forming step S22 is executed first, the result that the depth to the position of the overhang point is similarly increased can be obtained. That is, the first film forming step S21 may be performed after the second film forming step S22. In addition, the first film forming step S21 and the second film forming step S22 may be alternately performed multiple times.

Next, a case in which the refractive index (RI) of the silicon-containing film to be formed is changed will be described. In the first film forming step S21 and the second film forming step S22, the refractive index of the silicon-containing film is controlled by the flow rate ratio of the silicon-containing gas to the nitrogen-containing gas. For example, in the first film forming step S21, the flow rate ratio (A/B) of the silicon-containing gas:A to the nitrogen-containing gas:B is set to 0.5 to 0.8. In the second film forming step S22, the flow rate ratio (A/B) of the silicon-containing gas:A and the nitrogen-containing gas:B is set to 0.8 to 1.0.

The bias power applied to the stage 102 is the same in the first film forming step S21 and the second film forming step S22. For example, in the first film forming step S21 and the second film forming step S22, a bias power of 0 W to 1,000 W is applied to the stage 102. The bias power applied to the stage 102 may be changed. For example, as described above, in the first film forming step S21, a higher bias power may be applied to the stage 102 than that in the second film forming step S22 to form a silicon-containing film.

By forming a silicon-containing film having a low refractive index in the second film forming step S22, the insulating property (a leak characteristic) of the silicon-containing film can be improved. However, the silicon-containing film having a low refractive index tends to have a shallower depth to the overhang point than the silicon-containing film having a high refractive index.

Therefore, in the film forming step S2, the silicon-containing film is formed under the conditions where the flow rate ratio of the silicon-containing gas to the nitrogen-containing gas is changed between the first film forming step S21 and the second film forming step S22 and where the refractive index is higher in the first film forming step S21 than in the second film forming step S22. For example, after forming a SiN film 20a having a refractive index of 1.95 to 2.05 through the first film forming step S21 using $SiH_4$ gas as the silicon-containing gas and $NH_3$ gas as the nitrogen-containing gas, a SiN film 20b having a refractive index of 2.05 or more is formed through the second film forming step S22. As a result, the SiN film 20 formed of the SiN film 20a and the SiN film 20b can be formed as described above with reference to FIG. 4.

The processing conditions such as the types and flow rates of processing gases, and the bias powers in the first film forming step S21 and the second film forming step S22 are as follows.

<First Film Forming Step S21>
  Processing gas
    $SiH_4$ gas: 3 to 60 sccm (specifically, 7 to 20 sccm)
    $NH_3$ gas: 4 to 100 sccm (specifically, 9 to 40 sccm)
    Inert gas for dilution: Ar gas: 50 to 1,000 sccm (specifically, 50 to 300 sccm)
      Microwave power (860 MHz): 1,500 to 10,000 W (specifically, 2,500 to 5,000 W)
      Bias power (400 kHz): 200 to 1,000 W (specifically, 300 to 600 W)
<Second Film Forming Step S22>
  Processing gas
    $SiH_4$ gas: 3 to 60 sccm (specifically, 7 to 20 sccm, same as in the first film forming step S21)
    $NH_3$ gas: 4 to 100 sccm (specifically, 9 to 40 sccm, same as in the first film forming step S21)
    Inert gas for dilution: Ar gas: 50 to 1,000 sccm (specifically, 50 to 300 sccm)
      Bias power (400 kHz): 200 to 1,000 W (specifically, 300 to 600 W)

In the second film forming step S22, by increasing the supply amount of the $NH_3$ gas compared with the first film forming step S21, the flow rate ratio of the $SiH_4$ gas to the $NH_3$ gas is changed, and the refractive index of the SiN film to be formed is changed to be high. As a result, the depth of the SiN film formed on the convex portion to the overhang point increases.

The substrate W on which the silicon-containing film is formed through the film forming method according to the embodiment in the plasma processing apparatus 100 is carried out of the plasma processing apparatus 100, and subsequent steps, such as film formation through an ALD, are carried out.

Figure 7A:
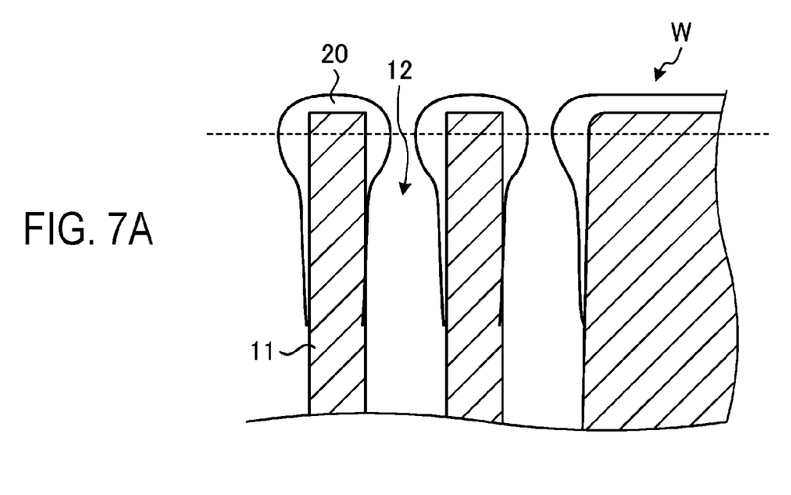
FIGS. 7A and 7B are views illustrating an example of subsequent steps performed on a substrate.
Figure 7B:
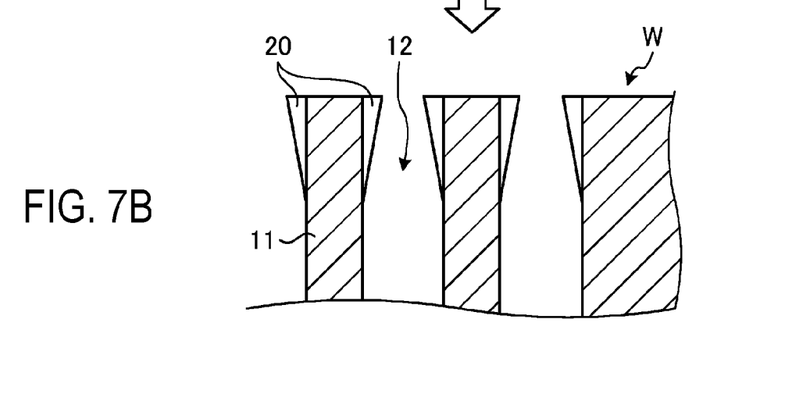

FIGS. 7A and 7B are views illustrating an example of subsequent steps performed on the substrate W. FIG. 7A illustrates the substrate W on which a SiN film 20 is formed as a silicon-containing film on the convex portions 11 through the film forming method according to the embodiment. The substrate W on which the SiN film 20 is formed is polished from the top surface side through, for example, chemical mechanical polishing (CMP) or the like. For example, the substrate W is polished to the position of the dotted line below the top surface of the convex portion 11 such that the top surfaces of the convex portions 11 are exposed. FIG. 7B illustrates a polished substrate W. Since the SiN film 20 has a deep overhang point, the SiN film may remain thick on the side surfaces of the convex portions 11 and may narrow the openings of the concave portions 12. In the subsequent step, film formation is executed through ALD on the substrate W in which the openings of the concave portions 12 are narrowed in this way.

Conventionally, an ALD process has a problem in large processing capacity (throughput) in a process time for film formation. Thus, in order to reduce the process time for film formation, the ALD process is executed in the state in which the concentration of an ALD precursor is increased. Theoretically, there is no problem if the ALD reaction is ideal and the ALD precursor is only chemically adsorbed to the surface of the material, so that a surplus ALD precursor is not physically adsorbed to the surface to be adsorbed after saturated chemical adsorption. However, in many cases, some of the ALD precursor that has entered deep inside into the underlayer concave portions is physically adsorbed. As a result, when ALD is performed on a substrate W that does not have a SiN film 20, a high-concentration ALD precursor penetrates from the opening sides of the concave portions 12. Thus, the film thickness is thicker in the upper portions of the concave portions 12 and thinner in the lower portions of the concave portions 12, thereby causing overhangs and poor step coverage. Therefore, it is conceivable to reduce the concentration of the ALD precursor, but the process time for film formation increases and the productivity decreases.

Meanwhile, when the ALD process is performed on the substrate W of FIG. 7B, even if a high-concentration ALD precursor is generated, the ALD precursor that penetrates into the concave portions 12 is reduced by narrowing the openings of the upper portions of the concave portions 12 so that the density of the effective ALD precursor that penetrates into the concave portions 12 can be reduced. Thus, a film can be formed with good step coverage.

The substrate W subjected to the ALD process is polished from the top surface side through, for example, CMP or the like to remove the SiN film 20.

In the embodiment, a silicon-containing film is formed by using a microwave plasma type plasma processing apparatus 100 that generates plasma by microwaves. However, it is also conceivable to form a silicon-containing film by using a capacitively coupled plasma (CCP) type plasma processing apparatus using parallel flat plates. However, in the CCP type plasma processing apparatus, the ion energy of plasma is high, and a silicon-containing film may be formed deep in the concave portions 12.

Figure 8:
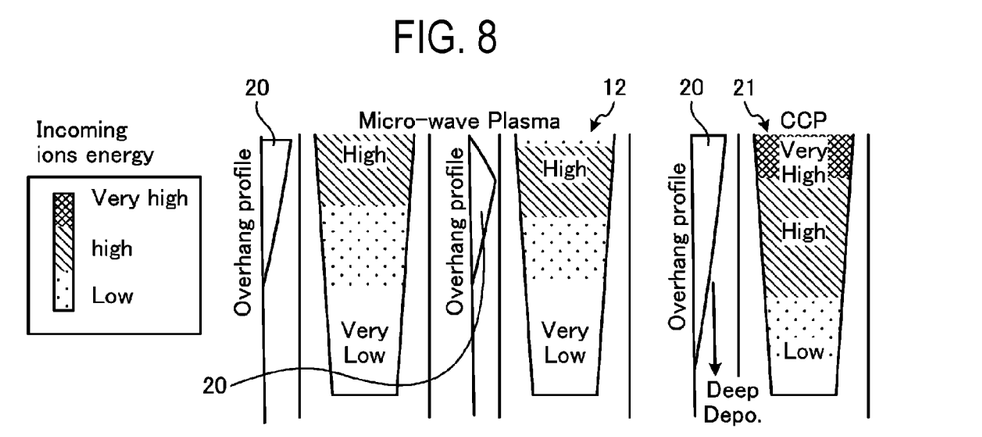
FIG. 8 is a view illustrating film formation by microwave plasma and capacitively coupled plasma (CCP).

FIG. 8 is a view illustrating film formation by microwave plasma and CCP. FIG. 8 illustrates cases in each of which a pattern of ion energy of plasma in a concave portion 12 when a SiN film 20 is formed on the substrate W by microwave plasma and CCP. In addition, FIG. 8 schematically illustrates the shapes of the SiN films 20, each of which is formed on a side wall of a concave portion 12 by microwave plasma and CCP. Since the CCP has a high plasma ion energy, a SiN film 20 is formed deep into a concave portion 12. Meanwhile, it is possible to reduce the ion energy of microwave plasma compared with that of CCP, and thus it is possible to reduce the range in which the SiN film 20 is formed. As a result, it is possible to form a film from a shallow position in the concave portion 12 in the subsequent step. In addition, for example, when the substrate W is polished through CMP or the like to remove the SiN film 20, it is possible to reduce the polishing depth.

In the above-described embodiments, the case in which a SiN film is formed as the silicon-containing film has been described as an example, but the silicon-containing film to be formed is not limited to the SiN film. For example, a carbon-containing gas, such as a $C_2H_6$ gas or a TMS $(CH_3)_3SiH$ gas, may be added to the processing gas to form a SiCN film as the silicon-containing film. In addition, for example, a diborane ($B_2H_6$) gas may be added to the processing gas to form a SiBN film as the silicon-containing film. For example, by adding a small amount of carbon-containing gas (e.g., about 0.1 to 10 sccm of $C_2H_6$ gas), it is possible to form a SiCN film that is more excellent in chemical resistance (HF wet etching resistance) without changing a film shape characteristic of the film forming step S2 (film number 20). Similarly, by adding a small amount of diborane ($B_2H_6$) gas (e.g., about 0.1 to 15 sccm), the effect of improving the chemical resistance to LAL buffered hydrofluoric acid (mixed solution of $NH_4F$ and HF) is obtained without changing the film shape characteristic of the film (film number 20).

As described above, the film forming method according to the embodiment includes the placing step S1 and the film forming step S2. In the placing step S1, the substrate W on which a pattern including a plurality of convex and concave portions is formed is placed on the stage 102 disposed in the chamber 101. In the film forming step S2, a bias power is applied to the stage 102, and microwaves are introduced into the chamber 101 while supplying a processing gas containing a silicon-containing gas and a nitrogen-containing gas into the chamber 101 to generate plasma, so that a silicon-containing film is selectively formed on the plurality of convex portions 11 of the pattern. The film forming step S2 includes the first film forming step S21 and the second film forming step S22. In the first film forming step S21, a silicon-containing film is formed around the upper sides of the plurality of convex portions 11. In the second film forming step S22, a silicon-containing film is formed on the upper portions of the plurality of convex portions 11. As a result, in the film forming method according to the embodiment, the shape of a silicon-containing film to be formed can be controlled to a shape in which a film having good uniformity is obtained in a concave portion through film formation by ALD.

In the first film forming step S21, a silicon-containing film is formed under at least one condition selected from the group consisting of a higher bias power than that in the second film forming step S22 is applied to the stage 102 and the refractive index is higher than that in the second film forming step S22. As a result, in the film forming method according to the embodiment, the position of the overhang point 21 of the silicon-containing film to be formed can be deepened.

In the first film forming step S21, a bias power of 200 W to 600 W is applied to the stage 102. In the second film forming step S22, a bias power of 0 to 200 W is applied to the stage 102. As a result, in the film forming method according to the embodiment, the position of the overhang point 21 of the silicon-containing film to be formed can be deepened by changing the bias power in this way between the first film forming step S21 and the second film forming step S22.

In the first film forming step S21, a silicon-containing film having a refractive index of 1.95 to 2.05 is formed. In the second film forming step S22, a silicon-containing film having a refractive index of 2.05 or more is formed. As a result, in the film forming method according to the embodiment, the position of the overhang point 21 of the silicon-containing film to be formed can be deepened by changing the refractive indices of the silicon-containing films formed in the first film forming step S21 and the second film forming step S22 as described above.

In the film forming step S2, ⅚ to ½ of the total film thickness of the silicon-containing film to be formed is formed through the first film forming step S21, and the rest of the total film thickness is formed through the film forming step S22. As a result, in the film forming method according to the embodiment, a silicon-containing film to be formed can be formed in a shape in which a film having good uniformity is obtained in a concave portion through film formation by ALD.

Although embodiments have been described above, it should be considered that the embodiments disclosed herein are illustrative and are not restrictive in all respects. Indeed, the above-described embodiments can be implemented in a variety of forms. In addition, the above-described embodiments may be omitted, replaced, or modified in various forms without departing from the scope and spirit of the claims.

For example, in the above-described embodiments, although the case in which the substrate W is a semiconductor wafer has been described as an example, the present disclosure is not limited thereto. In addition, as a pattern including a plurality of convex and concave portions, a structure having mainly vertical convex and concave portions, such as vias and trenches has been described as an example, but the present disclosure is not limited thereto. For example, the present disclosure is also useful for a substrate having a pattern including convex and concave portions in the horizontal direction in addition to the vertical direction, such as a 3D structure.

According to the present disclosure, a shape of a silicon-containing film to be formed can be controlled to a shape in which a film having good uniformity is obtained in a concave portion through film formation by ALD.

It should be understood that the embodiments disclosed herein are examples in all respects and are not restrictive. Indeed, the above-described embodiments can be implemented in various forms. The embodiments described above may be omitted, replaced, or modified in various forms without departing from the scope and spirit of the appended claims.

What is claimed is:

1. A film forming method comprising:
   placing a substrate on which a pattern, which includes a plurality of convex and concave portions, is formed on a stage disposed inside a chamber; and
   selectively forming a silicon-containing film on the plurality of convex portions of the pattern by applying a bias power to the stage and introducing microwaves into the chamber while supplying a processing gas containing a silicon-containing gas and a nitrogen-containing gas into the chamber to generate plasma, wherein the selectively forming the silicon-containing film includes a first film formation of forming a silicon-containing film around upper sides of the plurality of convex portions and a second film formation of forming a silicon-containing film on upper portions of the plurality of convex portions.

2. The film forming method of claim 1, wherein, in the first film formation, the silicon-containing film is formed under at least one condition selected from the group consisting of a higher bias power than a bias power in the second film formation is applied to the stage and a refractive index is higher than a refractive index in the second film formation.

3. The film forming method of claim 2, wherein, in the first film formation, a bias power of 200 W to 1,000 W is applied to the stage, and
in the second film formation, a bias power of 0 to 200 W is applied to the stage.

4. The film forming method of claim 3, wherein the silicon-containing gas is any one selected from a group consisting of $SiH_4$, $Si_2H_6$, and $SiH_2Cl_4$, and the nitrogen-containing gas is either $NH_3$ or $N_2$.

5. The film forming method of claim 4, wherein the processing gas further includes a carbon-containing gas.

6. The film forming method of claim 5, wherein the carbon-containing gas is any one selected from a group consisting of $C_2H_6$, $CH_4$, and $C_3H_8$.

7. The film forming method of claim 6, wherein, in the selectively forming the silicon-containing film, 5/6 to 1/2 of a total film thickness of the silicon-containing film to be formed is formed through the first film formation, and a rest of the total film thickness is formed through the second film formation.

8. The film forming method of claim 7, wherein in the selectively forming the silicon-containing film, any one of a SiN film, a SiCN film, and a SiBN film is formed as the silicon-containing film.

9. The film forming method of claim 2, wherein, in the first film formation, the silicon-containing film that is formed has a refractive index of 1.95 to 2.05, and in the second film formation, the silicon-containing film that is formed has a refractive index of 2.05 or more.

10. The film forming method of claim 9, wherein, in the first film formation and the second film formation, a refractive index of the silicon-containing film is controlled by a flow rate ratio of the silicon-containing gas to the nitrogen-containing gas.

11. The film forming method of claim 1, wherein, in the first film formation, a bias power of 200 W to 1,000 W is applied to the stage, and
in the second film formation, a bias power of 0 to 200 W is applied to the stage.

12. The film forming method of claim 1, wherein, in the first film formation, the silicon-containing film that is formed has a refractive index of 1.95 to 2.05, and in the second film formation, the silicon-containing film that is formed has a refractive index of 2.05 or more.

13. The film forming method of claim 1, wherein, in the first film formation and the second film formation, a refractive index of the silicon-containing film is controlled by a flow rate ratio of the silicon-containing gas to the nitrogen-containing gas.

14. The film forming method of claim 1, wherein, in the first film formation, a flow rate ratio of the silicon-containing gas to the nitrogen-containing gas is set to 0.5 to 0.8, and
in the second film formation, the flow rate ratio of the silicon-containing gas to the nitrogen-containing gas is set to 0.8 to 1.00.

15. The film forming method of claim 1, wherein, in the first film formation and the second film formation, a same bias power is applied to the stage.

16. The film forming method of claim 1, wherein the silicon-containing gas is any one selected from a group consisting of $SiH_4$, $Si_2H_6$, and $SiH_2Cl_4$, and the nitrogen-containing gas is either $NH_3$ or $N_2$.

17. The film forming method of claim 1, wherein the processing gas further includes a carbon-containing gas.

18. The film forming method of claim 1, wherein, in the selectively forming the silicon-containing film, 5/6 to 1/2 of a total film thickness of the silicon-containing film to be formed is formed through the first film formation, and a rest of the total film thickness is formed through the second film formation.

19. The film forming method of claim 1, wherein in the selectively forming the silicon-containing film, any one of a SiN film, a SiCN film, and a SiBN film is formed as the silicon-containing film.

20. A film formation apparatus comprising:
a stage disposed within a chamber and configured to place thereon a substrate on which a pattern including a plurality of convex and concave portions is formed;
a power supply configured to apply a bias power to the stage;
a gas supplier configured to supply a processing gas containing a silicon-containing gas and a nitrogen-containing gas into the chamber;
a plasma source configured to generate and radiates microwaves into the chamber; and
a controller configured to: control the power supply to apply the bias power to the stage, and control the plasma source to introduce the microwaves into the chamber while controlling the gas supplier to supply the processing gas containing the silicon-containing gas and the nitrogen-containing gas into the chamber so as to generate plasma such that a first film formation of forming a silicon-containing film around upper sides of the plurality of convex portions and a second film formation of forming a silicon-containing film above the plurality of convex portions are executed to selectively form a silicon-containing film on the plurality of convex portions.

* * * * *